(12) United States Patent
Yokoo et al.

(10) Patent No.: US 10,892,424 B2
(45) Date of Patent: Jan. 12, 2021

(54) COMPOSITION FOR MANUFACTURING ORGANIC SEMICONDUCTOR DEVICE

(71) Applicant: DAICEL CORPORATION, Osaka (JP)

(72) Inventors: Takeshi Yokoo, Himeji (JP); Youji Suzuki, Himeji (JP); Yasuyuki Akai, Himeji (JP)

(73) Assignee: DAICEL CORPORATION, Osaka (JP)

( * ) Notice: Subject to any disclaimer, the term of this patent is extended or adjusted under 35 U.S.C. 154(b) by 38 days.

(21) Appl. No.: 16/308,352

(22) PCT Filed: May 17, 2017

(86) PCT No.: PCT/JP2017/018473
§ 371 (c)(1),
(2) Date: Dec. 7, 2018

(87) PCT Pub. No.: WO2017/212882
PCT Pub. Date: Dec. 14, 2017

(65) Prior Publication Data
US 2019/0214580 A1    Jul. 11, 2019

(30) Foreign Application Priority Data

Jun. 9, 2016 (JP) .................. 2016-115659

(51) Int. Cl.
*H01L 51/05* (2006.01)
*H01L 51/00* (2006.01)
(52) U.S. Cl.
CPC .......... *H01L 51/0074* (2013.01); *H01L 51/05* (2013.01); *H01L 51/0004* (2013.01)
(58) Field of Classification Search
CPC . H01L 51/0074; H01L 51/05; H01L 51/0004; H01L 51/0007
See application file for complete search history.

(56) References Cited

U.S. PATENT DOCUMENTS 6,787,063 B2 * 9/2004 Endo ................. H01L 51/0004
106/169.12
9,853,225 B2   12/2017 Takeya et al.
(Continued)

FOREIGN PATENT DOCUMENTS

JP    2003-234522 A   8/2003
JP    2011-134757 A   7/2011
(Continued)

OTHER PUBLICATIONS

Extended European Search Report dated Jan. 24, 2020, in European Patent Application No. 17810063.2.
(Continued)

Primary Examiner — Mark Kopec
Assistant Examiner — Jaison P Thomas
(74) Attorney, Agent, or Firm — Birch, Stewart, Kolasch & Birch, LLP

(57) ABSTRACT

Provided is a composition for manufacturing an organic semiconductor device, the composition enabling formation of an organic semiconductor device that stably shows high carrier mobility.

A composition for manufacturing an organic semiconductor device contains 2,3-dihydrobenzofuran as a solvent and an organic semiconductor material below, in which the water content of the solvent is 0.25 wt % or less.

The organic semiconductor material: at least one compound selected from the group consisting of a compound represented by formula (1-1), a compound represented by formula (1-2), a compound represented by formula (1-3), a compound represented by formula (1-4), a compound represented by formula (1-5), and a compound represented by formula (1-6).

[Formula 1]

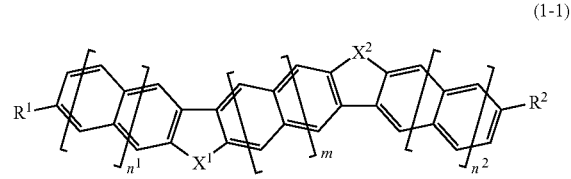

(1-1)

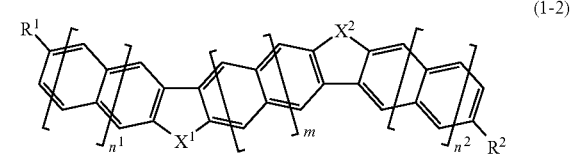

(1-2)

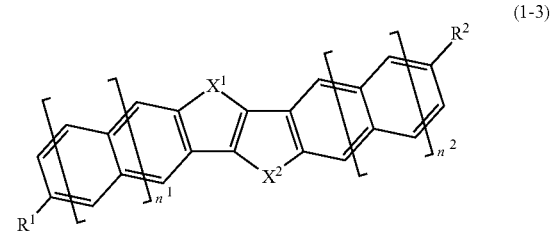

(1-3)

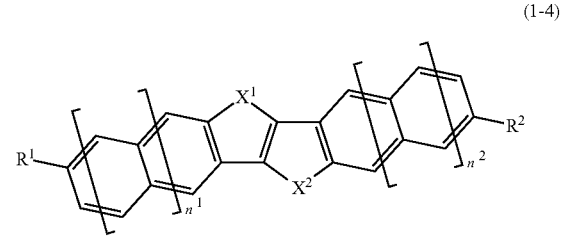

(1-4)

(Continued)

-continued

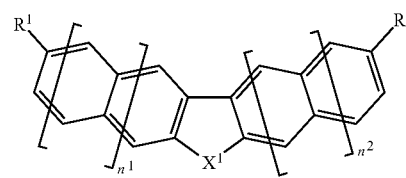
(1-5)

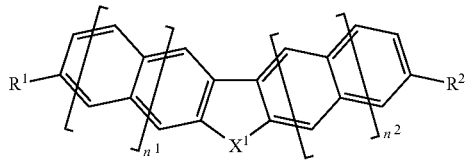

(1-6)

wherein $X^1$ and $X^2$ are the same or different and each represent an oxygen atom, a sulfur atom, or a selenium atom, m is 0 or 1, $n^1$ and $n^2$ are the same or different and each represent 0 or 1, and $R^1$ and $R^2$ are the same or different and each represent a fluorine atom, a $C_{1-20}$ alkyl group, a $C_{6-13}$ aryl group, a pyridyl group, a furyl group, a thienyl group, or a thiazolyl group, in which 1 or 2 or more hydrogen atoms contained in the alkyl group may be substituted by a fluorine atom, and in which 1 or 2 or more hydrogen atoms contained in the aryl group, the pyridyl group, the furyl group, the thienyl group, and the thiazolyl group may be substituted by a fluorine atom or an alkyl group having 1 to 10 carbon atoms.

6 Claims, No Drawings

(56) References Cited

U.S. PATENT DOCUMENTS

| | | |
|---|---|---|
| 2003/0082858 A1 | 5/2003 | Morii et al. |
| 2009/0043113 A1* | 2/2009 | Park ............... C07D 495/04 |
| | | 549/41 |
| 2015/0014673 A1 | 1/2015 | Takeya et al. |
| 2016/0293849 A1 | 10/2016 | Suzuki et al. |
| 2018/0240977 A1* | 8/2018 | Yamamoto ............ C08K 5/07 |
| 2019/0006603 A1* | 1/2019 | Suzuki ............ H01L 51/0067 |

FOREIGN PATENT DOCUMENTS

| | | |
|---|---|---|
| JP | 2014-110347 A | 6/2014 |
| WO | WO 2013/125599 A1 | 8/2013 |
| WO | WO 2014/136827 A1 | 9/2014 |
| WO | WO 2015/076171 A1 | 5/2015 |

OTHER PUBLICATIONS

International Search Report for PCT/JP2017/018473 (PCT/ISA/210) dated Aug. 8, 2017.

Written Opinion of the International Searching Authority for PCT/JP2017/018473 (PCT/ISA/237) dated Aug. 8, 2017.

\* cited by examiner

COMPOSITION FOR MANUFACTURING ORGANIC SEMICONDUCTOR DEVICE

TECHNICAL FIELD

The present invention relates to a composition that contains an annelated π-conjugated molecule, which is an organic semiconductor material, dissolved in a solvent and is used for manufacturing an organic semiconductor device by printing.

BACKGROUND ART

Transistors, which are important semiconductor devices included in displays and computers, are currently manufactured using inorganic semiconductor materials such as polysilicon and amorphous silicon. Manufacture of thin film transistors using inorganic semiconductor materials by plasma-enhanced chemical vapor deposition (PECVD) or sputtering has problems that the temperature in the manufacturing process is high, that the manufacturing equipment is expensive and therefore raises the costs, and that the properties of transistors tend to be uneven when large-area thin film transistors are formed. In addition, the temperature in the manufacturing process limits available substrates, and glass substrates have therefore been mainly used. However, since glass substrates have high heat resistance but have low impact resistance and low flexibility and since it is difficult to reduce the weight of glass substrates, it has been difficult to form light and flexible transistors using glass substrates.

Accordingly, organic semiconductor devices employing organic semiconductor materials have been studied and developed actively in recent years. This is because the use of organic semiconductor materials enables manufacture of organic semiconductor devices at low manufacturing process temperatures by a simple method such as application, enables use of plastic substrates having low heat resistance, and enables weight reduction, flexibilization, and cost reduction of electronic devices such as displays.

Patent Literature 1 discloses an N-shaped annelated π-conjugated molecule as an organic semiconductor material with good carrier mobility. It is also disclosed that a substance such as o-dichlorobenzene and 1,2-dimethoxybenzene is used as a solvent to dissolve the organic semiconductor material.

CITATION LIST

Patent Literature

Patent Literature 1: International Publication No. WO 2014/136827

SUMMARY OF INVENTION

Technical Problem

By the way, some compositions for manufacturing an organic semiconductor device employing an organic semiconductor material provide high carrier mobility while other compositions provide low carrier mobility, even with the same solvent.

Hence, the present invention has an object to provide a composition for manufacturing an organic semiconductor device, the composition enabling formation of an organic semiconductor device that stably shows high carrier mobility.

Solution to Problem

After earnest studies to solve the above problem, the present inventors have found that using a specific solvent with a water content of not more than a specific value and a specific organic semiconductor material achieves formation of an organic semiconductor device that stably shows high carrier mobility. The present invention has been completed on the basis of these findings.

That is, the present invention provides a composition for manufacturing an organic semiconductor device, containing 2,3-dihydrobenzofuran as a solvent and an organic semiconductor material below, wherein the water content of the solvent is 0.25 wt % or less.

The organic semiconductor material: at least one compound selected from the group consisting of a compound represented by formula (1-1), a compound represented by formula (1-2), a compound represented by formula (1-3), a compound represented by formula (1-4), a compound represented by formula (1-5), and a compound represented by formula (1-6):

[Formula 1]

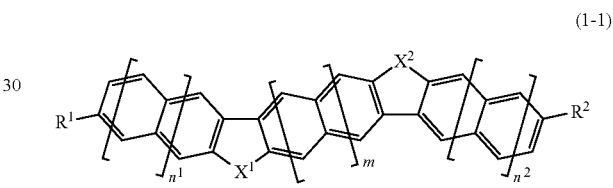

(1-1)

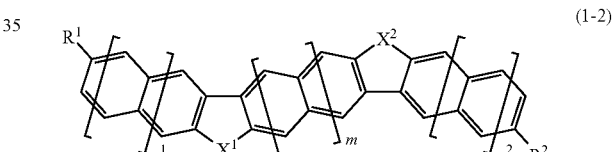

(1-2)

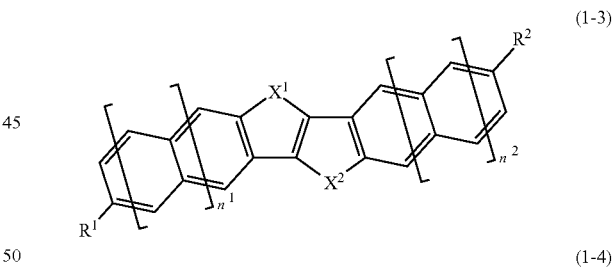

(1-3)

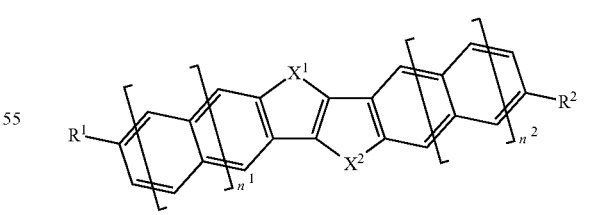

(1-4)

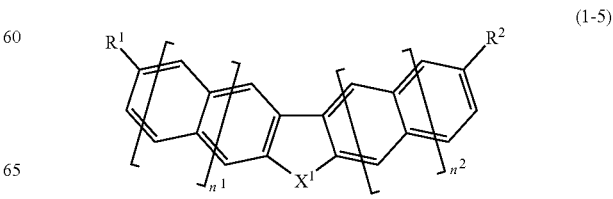

(1-5)

-continued

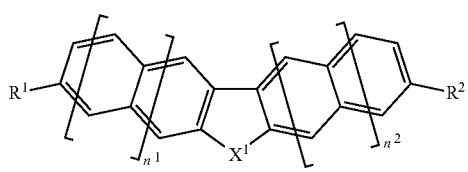
(1-6)

wherein $X^1$ and $X^2$ are the same or different and each represent an oxygen atom, a sulfur atom, or a selenium atom. m is 0 or 1. $n^1$ and $n^2$ are the same or different and each represent 0 or 1. $R^1$ and $R^2$ are the same or different and each represent a fluorine atom, a $C_{1-20}$ alkyl group, a $C_{6-13}$ aryl group, a pyridyl group, a furyl group, a thienyl group, or a thiazolyl group, wherein 1 or 2 or more hydrogen atoms contained in the alkyl group may be substituted by a fluorine atom, and wherein 1 or 2 or more hydrogen atoms contained in the aryl group, the pyridyl group, the furyl group, the thienyl group, or the thiazolyl group may be substituted by a fluorine atom or an alkyl group having 1 to 10 carbon atoms.

The organic semiconductor material is preferably at least one compound selected from the group consisting of a compound represented by formula (1-7), a compound represented by formula (1-8), a compound represented by formula (1-9), and a compound represented by formula (1-10):

[Formula 2]

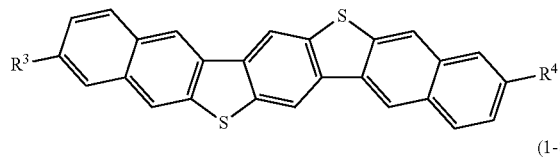
(1-7)

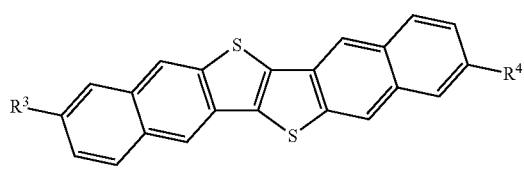
(1-8)

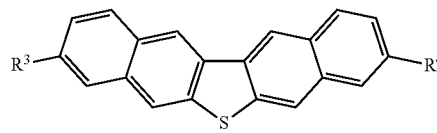
(1-9)

(1-10)

wherein $R^3$ and $R^4$ are the same or different and each represent a $C_{1-20}$ alkyl group, a $C_{6-13}$ aryl group, a pyridyl group, a furyl group, a thienyl group, or a thiazolyl group.)

The content of the solvent in the composition for manufacturing an organic semiconductor device is preferably 99.999 wt % or less.

The content of the organic semiconductor material in the composition for manufacturing an organic semiconductor device is preferably 0.005 parts by weight or more per 100 parts by weight of the solvent.

The content of 2,3-dihydrobenzofuran in the solvent contained in the composition for manufacturing an organic semiconductor device is preferably 50 wt % or more.

The content of the at least one compound selected from the group consisting of the compound represented by formula (1-1), the compound represented by formula (1-2), the compound represented by formula (1-3), the compound represented by formula (1-4), the compound represented by formula (1-5), and the compound represented by formula (1-6) in the organic semiconductor material contained in the composition for manufacturing an organic semiconductor device is preferably 50 wt % or more.

That is, the present invention relates to the followings.

[1] A composition for manufacturing an organic semiconductor device, comprising 2,3-dihydrobenzofuran as a solvent and a semiconductor material, wherein the water content of the solvent is 0.25 wt % or less, and the organic semiconductor material comprises at least one compound selected from the group consisting of a compound represented by formula (1-1), a compound represented by formula (1-2), a compound represented by formula (1-3), a compound represented by formula (1-4), a compound represented by formula (1-5), and a compound represented by formula (1-6):

[Formula 1]

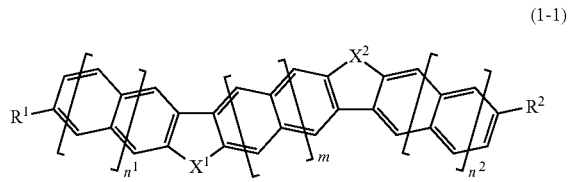
(1-1)

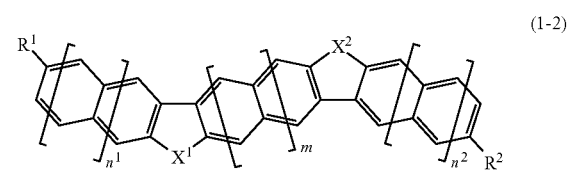
(1-2)

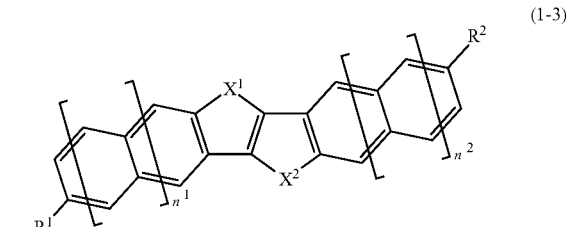
(1-3)

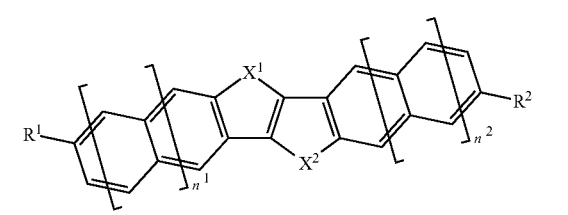
(1-4)

-continued

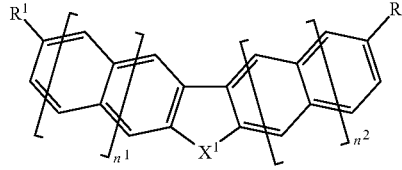
(1-5)

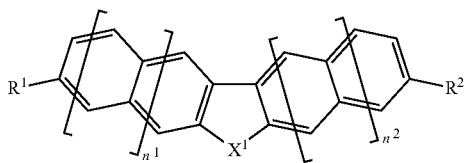
(1-6)

wherein $X^1$ and $X^2$ are the same or different and each represent an oxygen atom, a sulfur atom, or a selenium atom. m is 0 or 1. $n^1$ and $n^2$ are the same or different and each represent 0 or 1. $R^1$ and $R^2$ are the same or different and each represent a fluorine atom, a $C_{1-20}$ alkyl group, a $C_{6-13}$ aryl group, a pyridyl group, a furyl group, a thienyl group, or a thiazolyl group, wherein 1 or 2 or more hydrogen atoms contained in the alkyl group may be substituted by a fluorine atom, and wherein 1 or 2 or more hydrogen atoms contained in the aryl group, the pyridyl group, the furyl group, the thienyl group, or the thiazolyl group may be substituted by a fluorine atom or an alkyl group having 1 to 10 carbon atoms.)

[2] The composition for manufacturing an organic semiconductor device according to [1], wherein the organic semiconductor material is at least one compound selected from the group consisting of the compound represented by formula (1-1), the compound represented by formula (1-4), and the compound represented by formula (1-6).

[3] The composition for manufacturing an organic semiconductor device according to [1] or [2], wherein $X^2$ and $X^2$ are the same or different and each represent an oxygen atom or a sulfur atom.

[4] The composition for manufacturing an organic semiconductor device according to any one of [1] to [3], wherein m is 0.

[5] The composition for manufacturing an organic semiconductor device according to any one of [1] to [4], wherein $n^1$ and $n^2$ each represent 1.

[6] The composition for manufacturing an organic semiconductor device according to any one of [1] to [5], wherein $R^1$ and $R^2$ are the same or different and each represent a $C_{1-20}$ alkyl group (preferably a $C_{4-15}$ alkyl group, more preferably a $C_{6-12}$ alkyl group, further preferably a $C_{6-10}$ alkyl group), a $C_{6-13}$ aryl group (preferably a phenyl group), a pyridyl group, a furyl group, a thienyl group, or a thiazolyl group (note that one or more hydrogen atom contained in the alkyl group may be substituted by a fluorine atom and that one or more hydrogen atom contained in the aryl group, the pyridyl group, the furyl group, the thienyl group, and the thiazolyl group may be substituted by a fluorine atom or an alkyl group having 1 to 10 carbon atoms).

[7] The composition for manufacturing an organic semiconductor device according to any one of [1] to [5], wherein $R^1$ and $R^2$ are the same or different and each represent a $C_{1-20}$ alkyl group (preferably a $C_{4-15}$ alkyl group, more preferably a $C_{6-12}$ alkyl group, further preferably a $C_{6-10}$ alkyl group) (note that one or more hydrogen atom contained in the alkyl group may be substituted by a fluorine atom).

[8] The composition for manufacturing an organic semiconductor device according to [1], wherein the organic semiconductor material is at least one compound selected from the group consisting of a compound represented by formula (1-7), a compound represented by formula (1-8), a compound represented by formula (1-9), and a compound represented by formula (1-10):

[Formula 2]

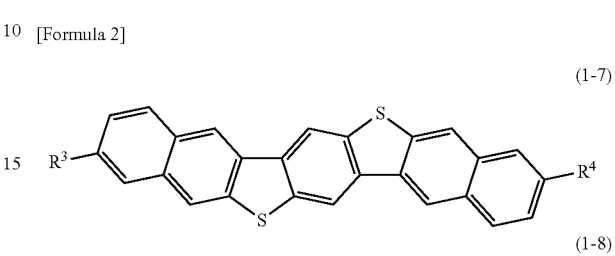
(1-7)

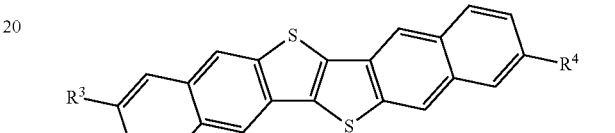
(1-8)

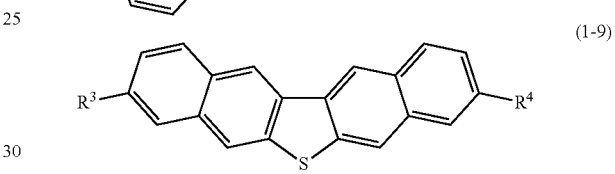
(1-9)

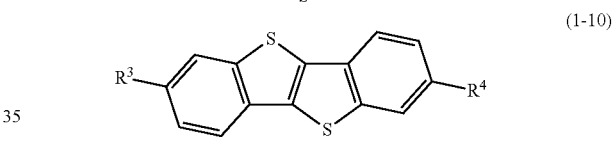
(1-10)

wherein $R^3$ and $R^4$ are the same or different and each represent a $C_{1-20}$ alkyl group, a $C_{6-13}$ aryl group, a pyridyl group, a furyl group, a thienyl group, or a thiazolyl group.

[9] The composition for manufacturing an organic semiconductor device according to [8], wherein $R^3$ and $R^4$ are the same or different and each represent a $C_{1-20}$ alkyl group (preferably a $C_{4-15}$ alkyl group, more preferably a $C_{6-12}$ alkyl group, further preferably a $C_{6-10}$ alkyl group), a phenyl group, a furyl group, or a thienyl group.

[10] The composition for manufacturing an organic semiconductor device according to [8], wherein $R^3$ and $R^4$ are the same or different and each represent a $C_{1-20}$ alkyl group (preferably a $C_{4-15}$ alkyl group, more preferably a $C_{6-12}$ alkyl group, further preferably a $C_{6-10}$ alkyl group).

[11] The composition for manufacturing an organic semiconductor device according to any one of [8] to [10], wherein the content of the at least one compound selected from the group consisting of the compound represented by formula (1-7), the compound represented by formula (1-8), the compound represented by formula (1-9), and the compound represented by formula (1-10) in the organic semiconductor material contained in the composition for manufacturing an organic semiconductor device is 50 wt % or more (preferably 80 wt % or more, more preferably 90 wt % or more, further preferably 95 wt % or more).

[12] The composition for manufacturing an organic semiconductor device according to any one of [1] to [11], wherein the content of the solvent (preferably 2,3-dihydrobenzofuran) in the composition for manufacturing an organic semiconductor device is 99.999 wt % or less.

[13] The composition for manufacturing an organic semiconductor device according to any one of [1] to [12], wherein the content of the solvent (preferably 2,3-dihydrobenzofuran) in the composition for manufacturing an organic semiconductor device is 90.000 wt % or more (preferably 93.000 wt % or more, more preferably 95.000 wt % or more, further preferably 98.990 wt % or more).

[14] The composition for manufacturing an organic semiconductor device according to any one of [1] to [13], wherein the content of the organic semiconductor material (preferably the at least one compound selected from the group consisting of the compound represented by formula (1-1), the compound represented by formula (1-2), the compound represented by formula (1-3), the compound represented by formula (1-4), the compound represented by formula (1-5), and the compound represented by formula (1-6)) in the composition for manufacturing an organic semiconductor device is 0.005 parts by weight or more (preferably 0.008 parts by weight or more, more preferably 0.01 parts by weight or more) based on 100 parts by weight of the solvent.

[15] The composition for manufacturing an organic semiconductor device according to any one of [1] to [14], wherein the content of the organic semiconductor material (preferably the at least one compound selected from the group consisting of the compound represented by formula (1-1), the compound represented by formula (1-2), the compound represented by formula (1-3), the compound represented by formula (1-4), the compound represented by formula (1-5), and the compound represented by formula (1-6)) in the composition for manufacturing an organic semiconductor device is 1 part by weight or less (preferably 0.5 parts by weight or less, more preferably 0.2 parts by weight or less) based on 100 parts by weight of the solvent.

[16] The composition for manufacturing an organic semiconductor device according to any one of [1] to [15], wherein the content of 2,3-dihydrobenzofuran in the solvent contained in the composition for manufacturing an organic semiconductor device is 50 wt % or more (preferably 80 wt % or more, more preferably 90 wt % or more, further preferably 95 wt % or more).

[17] The composition for manufacturing an organic semiconductor device according to any one of [1] to [16], wherein the content of the at least one compound selected from the group consisting of the compound represented by formula (1-1), the compound represented by formula (1-2), the compound represented by formula (1-3), the compound represented by formula (1-4), the compound represented by formula (1-5), and the compound represented by formula (1-6) in the organic semiconductor material contained in the composition for manufacturing an organic semiconductor device is 50 wt % or more (preferably 80 wt % or more, more preferably 90 wt % or more, further preferably 95 wt % or more).

[18] The composition for manufacturing an organic semiconductor device according to [17], wherein the content of at least one compound selected from the group consisting of the compound represented by formula (1-1), the compound represented by formula (1-4), and the compound represented by formula (1-6) in the organic semiconductor material contained in the composition for manufacturing an organic semiconductor device is 50 wt % or more (preferably 80 wt % or more, more preferably 90 wt % or more, further preferably 95 wt % or more).

[19] The composition for manufacturing an organic semiconductor device according to any one of [1] to [18], wherein the water content of the solvent is 0.19 wt % or less (preferably 0.08 wt % or less, more preferably 0.05 wt % or less).

[20] The composition for manufacturing an organic semiconductor device according to any one of [1] to [19], the composition being capable of forming an organic semiconductor device showing a carrier mobility of 0.0005 cm$^2$/Vs or more (preferably 0.001 cm$^2$/Vs or more, more preferably 0.05 cm$^2$/Vs or more, further preferably 0.1 cm$^2$/Vs or more, particularly preferably 1.0 cm$^2$/Vs or more).

Advantageous Effects of Invention

With the composition for manufacturing an organic semiconductor device according to the present invention, an organic semiconductor device that stably shows high carrier mobility can be formed.

DESCRIPTION OF EMBODIMENTS

[Composition for Manufacturing Organic Semiconductor Device]

A composition for manufacturing an organic semiconductor device according to the present invention (which may be simply referred to as a "composition according to the present invention") contains 2,3-dihydrobenzofuran as a solvent and an organic semiconductor material below, and the solvent has a water content of 0.25 wt % or less. In this specification, compounds represented by formulas (1-1) to (1-6) may be collectively referred to as the "specific organic semiconductor material".

The organic semiconductor material: at least one compound selected from the group consisting of a compound represented by formula (1-1), a compound represented by formula (1-2), a compound represented by formula (1-3), a compound represented by formula (1-4), a compound represented by formula (1-5), and a compound represented by formula (1-6).

[Formula 3]

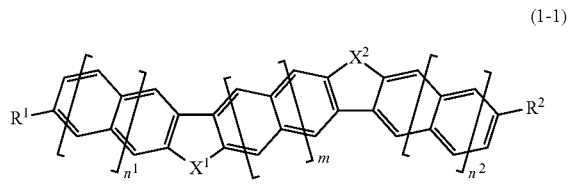

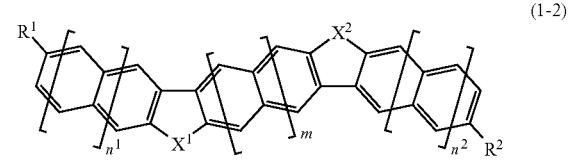

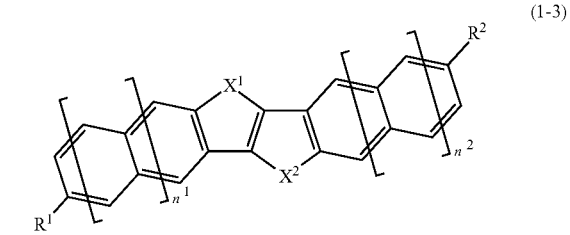

-continued (1-4)
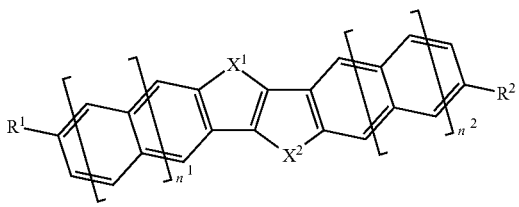

(1-5)
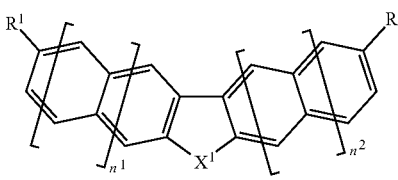

(1-6)
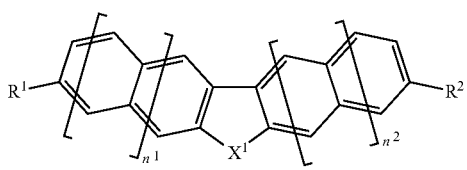

(Solvent)

2,3-Dihydrobenzofuran is a compound represented by formula (2) below. The composition according to the present invention contains 2,3-dihydrobenzofuran as a solvent. 2,3-Dihydrobenzofuran dissolves the specific organic semiconductor material particularly well at high concentrations, has a drying property suitable for the temperatures in the process, and is apt to form the organic semiconductor material into a single crystal in a thin film. Using 2,3-dihydrobenzofuran in combination with the specific organic semiconductor material allows an organic semiconductor device formed by the composition according to the present invention to show high carrier mobility.

[Formula 4]

(2)
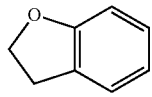

There is no particular limitation on the content of 2,3-dihydrobenzofuran in the total amount (100 wt %) of the solvent contained in the composition according to the present invention, but the content is preferably 50 wt % or more (such as 50 to 100 wt %), more preferably 80 wt % or more, further preferably 90 wt % or more, particularly preferably 95 wt % or more. When the content is 50 wt % or more, the solubility of the specific organic semiconductor material is further improved, and the organic semiconductor material further tends to be formed into a single crystal in a thin film.

The composition according to the present invention may contain solvent(s) (other solvent(s)) other than 2,3-dihydrobenzofuran. Examples of the other solvent(s) above include solvents that are commonly used for electronic materials and are compatible with 2,3-dihydrobenzofuran. One or two or more types of the other solvents above may be contained.

As described above, the water content of the solvent used for the composition according to the present invention is 0.25 wt % or less. A high water content of the composition according to the present invention tends to lower the carrier mobility, which is considered to be because crystallization of the specific organic semiconductor material is hindered and because the water is carrier-trapped. If the water content of the composition according to the present invention containing 2,3-dihydrobenzofuran and the specific organic semiconductor material is 0.25 wt % or less, high carrier mobility is stably obtained. The water content is preferably 0.19 wt % or less, more preferably 0.08 wt % or less, further preferably 0.05 wt % or less. The water content of 2,3-dihydrobenzofuran preferably falls within the above range. The water content can be measured by the Karl Fischer method.

(Organic Semiconductor Material)

The composition according to the present invention contains at least one compound selected from the group consisting of the compound represented by formula (1-1), the compound represented by formula (1-2), the compound represented by formula (1-3), the compound represented by formula (1-4), the compound represented by formula (1-5), and the compound represented by formula (1-6) as the organic semiconductor material. The specific organic semiconductor material forms a herringbone structure of an organic semiconductor and has two-dimensional overlaps between π-electrons, thereby exhibiting high carrier mobility and high transistor properties as an organic semiconductor.

In formulas (1-1) to (1-6), $X^1$ and $X^2$ are the same or different and each represent an oxygen atom, a sulfur atom, or a selenium atom. Among these atoms, an oxygen atom or a sulfur atom is preferable because high carrier mobility is obtained, and a sulfur atom is particularly preferable.

m is 0 or 1, preferably 0 because good solubility in 2,3-dihydrobenzofuran and high carrier mobility are obtained.

$n^1$ and $n^2$ are the same or different and each represent 0 or 1, preferably 1 because good solubility in 2,3-dihydrobenzofuran and high carrier mobility are obtained.

$R^1$ and $R^2$ are the same or different and each represent a fluorine atom, a $C_{1-20}$ alkyl group, a $C_{6-13}$ aryl group, a pyridyl group, a furyl group, a thienyl group, or a thiazolyl group.

Examples of the $C_{1-20}$ alkyl group for $R^1$ and $R^2$ include linear or branched alkyl groups such as a methyl group, an ethyl group, a propyl group, an isopropyl group, a n-butyl group, a t-butyl group, a n-pentyl group, a n-hexyl group, a n-heptyl group, a n-decyl group, a n-undecyl group, and a n-tetradecyl group. Among these groups, a $C_{4-15}$ alkyl group is preferable, a $C_{6-12}$ alkyl group is more preferable, and a $C_{6-10}$ alkyl group is further preferable. One or two or more hydrogen atoms contained in the $C_{1-20}$ alkyl group may be substituted by a fluorine atom.

Examples of the $C_{6-13}$ aryl group for $R^1$ and $R^2$ include phenyl, naphthyl, fluorenyl, and biphenylyl groups. Among these groups, a phenyl group is preferable.

Examples of the pyridyl group include 2-pyridyl, 3-pyridyl, and 4-pyridyl groups.

Examples of the furyl group include 2-furyl and 3-furyl groups.

Examples of the thienyl group include 2-thienyl and 3-thienyl groups.

Examples of the thiazolyl group include a 2-thiazolyl group.

One or two or more hydrogen atoms contained in the aryl group, the pyridyl group, the furyl group, the thienyl group, and the thiazolyl group may be substituted by a fluorine atom or an alkyl group having 1 to 10 carbon atoms. Examples of the alkyl group having 1 to 10 carbon atoms include linear or branched alkyl groups such as a methyl group, an ethyl group, a propyl group, an isopropyl group, a n-butyl group, a t-butyl group, a n-pentyl group, a n-hexyl group, a n-heptyl group, and a n-decyl group. Among these groups, an alkyl group having 1 to 6 carbon atoms is preferable, and an alkyl group having 1 to 3 carbon atoms is particularly preferable. Examples of a group in which at least one hydrogen atom contained in the aryl group is substituted by an alkyl group having 1 to 10 carbon atoms include a tolyl group and a xylyl group.

Examples of a group in which at least one hydrogen atom contained in the aryl group is substituted by a fluorine atom include a p-fluorophenyl group and a pentafluorophenyl group.

Among these groups, $R^1$ and $R^2$ are preferably the same or different and each represent a $C_{1-20}$ alkyl group, a $C_{6-13}$ aryl group, a pyridyl group, a furyl group, a thienyl group, or a thiazolyl group, more preferably a $C_{1-20}$ alkyl group, because solubility in 2,3-dihydrobenzofuran and high carrier mobility are obtained.

Among the above specific organic semiconductor materials, the compound represented by formula (1-1), the compound represented by formula (1-4) and the compound represented by formula (1-6) are particularly preferable because their crystalline states can be maintained even at high temperatures higher than 120° C. and because thin-film crystals with good thermal stability can be easily obtained.

As the specific organic semiconductor material, a compound represented by formula (1-7), a compound represented by formula (1-8), a compound represented by formula (1-9), and a compound represented by formula (1-10) are particularly preferable.

[Formula 5]

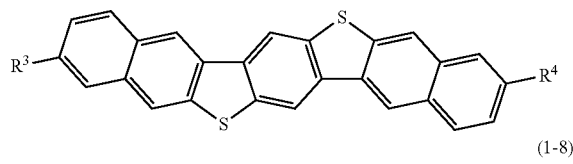

(1-7)
(1-8)
(1-9)
(1-10)

In the above formulas, $R^3$ and $R^4$ are the same or different and each represent a $C_{1-20}$ alkyl group, a $C_{6-13}$ aryl group, a pyridyl group, a furyl group, a thienyl group, or a thiazolyl group. Examples thereof include the above examples of the $C_{1-20}$ alkyl group, the $C_{6-13}$ aryl group, the pyridyl group, the furyl group, the thienyl group, and the thiazolyl group for $R^1$ and $R^2$. Among these groups, $R^3$ and $R^4$ preferably represent the same group because solubility in 2,3-dihydrobenzofuran and high carrier mobility are obtained, more preferably each represent a $C_{1-20}$ alkyl group, a phenyl group, a furyl group, or a thienyl group, further preferably each represent a $C_{1-20}$ alkyl group (among these groups, a $C_{4-15}$ alkyl group is preferable, a $C_{6-12}$ alkyl group is more preferable, and a $C_{6-10}$ alkyl group is further preferable).

The compound represented by formula (1-1) and the compound represented by formula (1-2) can be manufactured by, for example, the method disclosed in International Publication No. WO 2014/136827. Alternatively, for example, commercially available products bearing the trade names "$C_{10}$-DNBDT-NW", "$C_6$-DNBDT-NW", "$C_8$-DNBDT", and "$C_6$-DNT-VW" (manufactured by PI-CRYSTAL, INC.), the trade name "$C_{10}$-DNIT" (manufactured by Daicel Corporation), and the trade name "$C_8$-BTBT" (manufactured by Sigma-Aldrich Co. LLC) can be used as the specific organic semiconductor material.

The specific organic semiconductor material has a molecular structure in which benzene rings range on both sides of at least one bending point, which is a cross-link formed by a chalcogen atom, and in which substituents have been introduced into the benzene rings at both ends. Hence, their solubility in 2,3-dihydrobenzofuran is higher than the solubility of a linear molecule having about the same number of rings, and the precipitation is less likely to occur even at low temperatures.

The composition according to the present invention may contain an organic semiconductor material other than the above specific organic semiconductor material. There is no particular limitation on the content of the above specific organic semiconductor material in the total amount (100 wt %) of organic semiconductor materials contained in the composition according to the present invention, but 50 wt % or more (such as 50 to 100 wt %) is preferable, 80 wt % or more is more preferable, 90 wt % or more is further preferable, and 95 wt % or more is particularly preferable. In the case where two or more of the specific organic semiconductor materials are contained, the content is the total content of the two or more specific organic semiconductor materials.

[Composition for Manufacturing Organic Semiconductor Device]

The composition according to the present invention (composition for manufacturing an organic semiconductor device) contains 2,3-dihydrobenzofuran as a solvent and at least one compound selected from among the compound represented by formula (1-1), the compound represented by formula (1-2), the compound represented by formula (1-3), the compound represented by formula (1-4), the compound represented by formula (1-5), and the compound represented by formula (1-6) as the organic semiconductor material. The combination of 2,3-dihydrobenzofuran and the specific organic semiconductor material in the composition according to the present invention enables easy production of a thin-film single crystal having a herringbone structure in the planar direction of the substrate after applying and drying the composition according to the present invention, and a crystal structure that exhibits high carrier mobility and is suitable for providing high transistor properties of an organic semiconductor is obtained. The water content of the solvent is 0.25 wt % or less. With this constitution, the composition according to the present invention provides more stable and high carrier mobility than in the case where the water content is more than 0.25 wt %. One organic semiconductor material may be used singly, or two or more organic semiconductor materials may be used in combination.

The content of the solvent in the total amount (100 wt %) of the composition according to the present invention is, for example, 99.999 wt % or less. Its lower limit is, for example, 90.000 wt %, preferably 93.000 wt %, particularly preferably 95.000 wt %, and its upper limit is preferably 98.990 wt %. In particular, the content of 2,3-dihydrobenzofuran preferably falls within the above range.

There is no particular limitation on the content of the organic semiconductor material in the composition according to the present invention, but the content is, for example, 0.005 parts by weight or more, preferably 0.008 parts by weight or more, more preferably 0.01 parts by weight or more, based on 100 parts by weight of the solvent. The upper limit of the content of the organic semiconductor material is, for example, 1 part by weight, preferably 0.5 parts by weight, more preferably 0.2 parts by weight. In particular, the content of the specific organic semiconductor material preferably falls within the above range.

In addition to the solvent and the organic semiconductor material, components (such as epoxy resins, acrylic resins, cellulose resins, and butyral resins) commonly contained in compositions for manufacturing an organic semiconductor device may be blended into the composition according to the present invention as needed.

With the composition according to the present invention, an organic semiconductor device can be directly formed on a plastic substrate, which has lower heat resistance than the heat resistance of a glass substrate but is impact resistant, lightweight, and flexible, so that an impact resistant, lightweight, flexible display or computer can be formed. In addition, when the composition according to the present invention is applied over a substrate, the specific organic semiconductor material contained in the composition crystallizes by self-organization, so that an organic semiconductor device with a high carrier mobility (such as 0.0005 cm$^2$/Vs or more, preferably 0.001 cm$^2$/Vs or more, more preferably 0.05 cm$^2$/Vs or more, further preferably 0.1 cm$^2$/Vs or more, particularly preferably 1.0 cm$^2$/Vs or more) is obtained.

Since the composition according to the present invention can dissolve the specific organic semiconductor material at a high concentration, the specific organic semiconductor material can be dissolved at a high concentration even at relatively low temperatures (such as 20 to 100° C., preferably 20 to 80° C.). Hence, an organic electroluminescent element can be directly formed on a plastic substrate, which has lower heat resistance than the heat resistance of a glass substrate but is impact resistant, lightweight, and flexible, so that an impact resistant, lightweight, flexible display or computer can be formed. In addition, since the composition according to the present invention contains 2,3-dihydrobenzofuran as a solvent, when the composition is applied over a substrate, the specific organic semiconductor material crystallizes by self-organization, so that a thin film of an organic semiconductor crystal (such as an organic electroluminescent element) with high crystallinity is obtained. In addition, the thin film of an organic semiconductor crystal can be easily formed by simple application such as printing and spin coating, so that the costs can be greatly reduced.

The composition according to the present invention can be prepared by, for example, mixing 2,3-dihydrobenzofuran and the specific organic semiconductor material and heating the mixture in an air, nitrogen, or argon atmosphere at a temperature of about 70 to 150° C. for about 0.1 to 5 hours.

EXAMPLES

The following more specifically describes the present invention referring to Examples, but the Examples do not limit the present invention. The water content of 2,3-dihydrobenzofuran was measured with an apparatus bearing the trade name "Karl Fischer Titrator AQ-6 AQUA COUNTER" (manufactured by Hiranuma Sangyo Co., Ltd.).

Example 1

"$C_{10}$-DNIT" as an organic semiconductor material was mixed with 2,3-dihydrobenzofuran with a water content of 0.04 wt % as a solvent under an environment of 25° C. such that the concentration of the organic semiconductor material was 0.03 wt %, and the mixture was heated in a nitrogen atmosphere in a shaded environment at 100° C. for 3 hours, so that a composition (1) for manufacturing an organic semiconductor device was obtained. Dissolution of the organic semiconductor material in the resulting composition (1) for manufacturing an organic semiconductor device was confirmed by visual observation.

A silicon substrate (SiO$_2$, 100 μm in thickness) was washed with acetone and isopropanol using ultrasonic waves and was subjected to a UV ozone treatment at room temperature for 30 minutes. β-Phenethyltrichlorosilane was allowed to form a self-assembled monolayer at 120° C. for 30 minutes to coat the substrate. Washing with toluene and isopropanol using ultrasonic waves was then performed. The composition (1) for manufacturing an organic semiconductor device was applied over the silicon substrate by edge casting disclosed in International Publication No. WO 2013/125599. Subsequently, the product was dried in a vacuum at 100° C. for 10 hours, and gold (40 nm) was deposited by vacuum evaporation on the product to form source and drain electrodes. A bottom-gate top-contact organic field-effect transistor (with a channel length of 100 μm and a channel width of 2 mm) was thus produced. The carrier mobility of the resulting element was measured using a semiconductor parameter analyzer (model number: "keithley 4200", manufactured by Keithley Instruments, Inc.).

Examples 2 to 8

Compositions for manufacturing an organic semiconductor device were prepared in substantially the same manner as in Example 1 except that organic semiconductor materials shown in Table 1 were used and that the contents of the solvent and the organic semiconductor materials are changed as shown in Table 1, organic field-effect transistors were produced, and their carrier mobilities were evaluated.

Comparative Examples 1 to 4

Compositions for manufacturing an organic semiconductor device were prepared in substantially the same manner as in Example 1 except that organic semiconductor materials shown in Table 1 were used, that 2,3-dihydrobenzofuran with water contents shown in Table 1 were used as the solvent, and that the contents of the solvent and the organic semiconductor materials were changed as shown in Table 1, organic field-effect transistors were produced, and their carrier mobilities were evaluated.

TABLE 1

| | Organic semiconductor material (wt %) | | | | DHBF (wt %) | | | Carrier mobility |
|---|---|---|---|---|---|---|---|---|
| | | | | | Water content | Water content | Water content | |
| | $C_{10}$-CNTT | $C_8$-DNBDT | $C_6$-DNT-VW | $C_8$-BTBT | 0.04 wt % | 0.19 wt % | 0.26 wt % | (cm²/Vs) |
| Example 1 | 0.030 | | | | 99.970 | | | 1.1 |
| Example 2 | | 0.015 | | | 99.985 | | | 5.0 |
| Example 3 | | | 0.100 | | 99.900 | | | 0.007 |
| Example 4 | | | | 0.100 | 99.900 | | | 0.02 |
| Example 5 | 0.030 | | | | | 99.970 | | 0.15 |
| Example 6 | | 0.015 | | | | 99.985 | | 4.5 |
| Example 7 | | | 0.100 | | | 99.900 | | 0.0006 |
| Example 8 | | | | 0.100 | | 99.900 | | 0.012 |
| Comparative Example 1 | 0.030 | | | | | | 99.970 | 0.09 |
| Comparative Example 2 | | 0.015 | | | | | 99.985 | 3.7 |
| Comparative Example 3 | | | 0.100 | | | | 99.900 | 0.000001 |
| Comparative Example 4 | | | | 0.100 | | | 99.900 | 0.0028 |

<Organic Semiconductor Material>

$C_{10}$-DNIT: The compound represented by formula (1-11) below bearing the trade name "$C_{10}$-DNIT", manufactured by Daicel Corporation

[Formula 6]

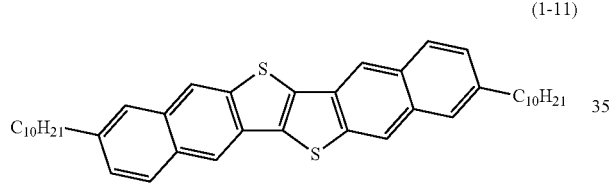

(1-11)

$C_8$-DNBDT: The compound represented by formula (1-12) below bearing the trade name "$C_8$-DNBDT", manufactured by PI-CRYSTAL, INC.

[Formula 7]

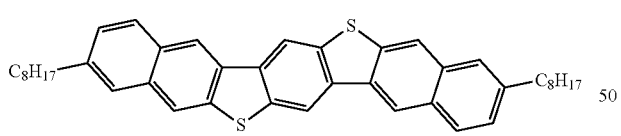

(1-12)

$C_6$-DNT-VW: The compound represented by formula (1-13) below bearing the trade name "$C_6$-DNT-VW", manufactured by PI-CRYSTAL, INC.

[Formula 8]

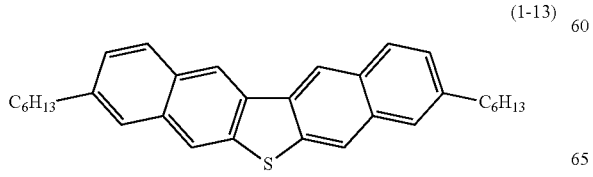

(1-13)

$C_8$-BTBT: The compound represented by formula (1-14) below bearing the trade name "$C_8$-BIBT", manufactured by Sigma-Aldrich Co. LLC

[Formula 9]

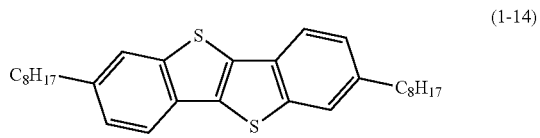

(1-14)

<Solvent>
DHBF: 2,3-Dihydrobenzofuran, manufactured by Daicel Corporation

INDUSTRIAL APPLICABILITY

The composition according to the present invention can be used for manufacturing an organic semiconductor device by printing.

The invention claimed is:
1. A composition for manufacturing an organic semiconductor device, comprising:
2,3-dihydrobenzofuran as a solvent; and
an organic semiconductor material,
wherein a water content of the solvent is 0.25 wt % or less, and
wherein the organic semiconductor material comprises at least one compound selected from the group consisting of a compound represented by formula (1-1), a compound represented by formula (1-2), a compound represented by formula (1-3), a compound represented by formula (1-4), a compound represented by formula (1-5), and a compound represented by formula (1-6):

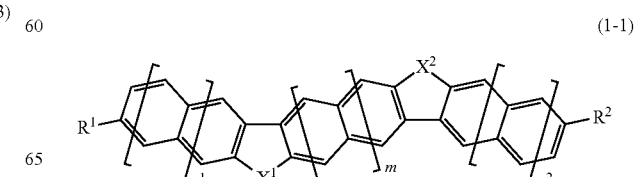

(1-1)

-continued (1-2)

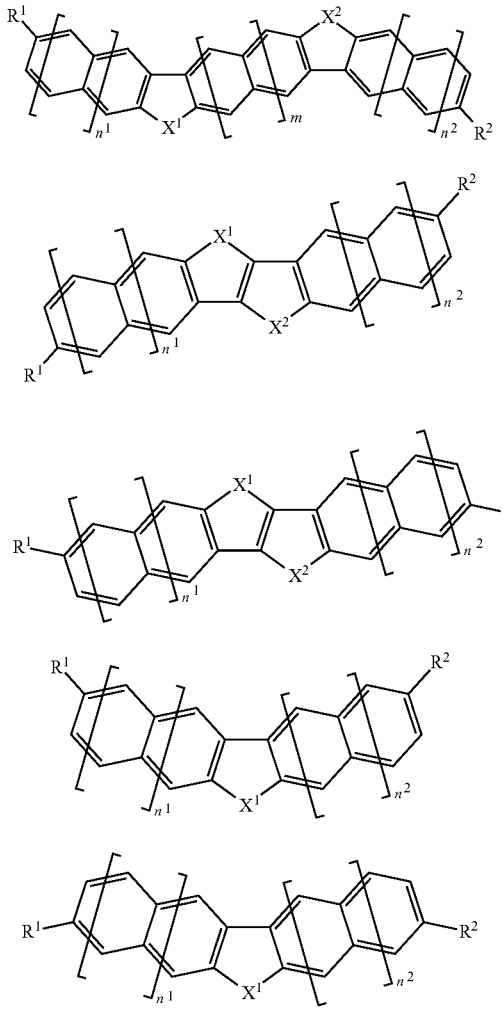

(1-3)

(1-4)

(1-5)

(1-6)

wherein $X^1$ and $X^2$ are the same or different and each represent an oxygen atom, a sulfur atom, or a selenium atom, m is 0 or 1, n' and $n^2$ are the same or different and each represent 0 or 1, and $R^1$ and $R^2$ are the same or different and each represent a fluorine atom, a $C_{1-20}$ alkyl group, a $C_{6-13}$ aryl group, a pyridyl group, a furyl group, a thienyl group, or a thiazolyl group, wherein 1 or 2 or more hydrogen atoms contained in the alkyl group may be substituted by a fluorine atom, and wherein 1 or 2 or more hydrogen atoms contained in the aryl group, the pyridyl group, the furyl group, the thienyl group, and the thiazolyl group may be substituted by a fluorine atom or an alkyl group having 1 to 10 carbon atoms.

2. The composition for manufacturing an organic semiconductor device according to claim 1, wherein the organic semiconductor material comprises at least one compound selected from the group consisting of a compound represented by formula (1-7), a compound represented by formula (1-8), a compound represented by formula (1-9), and a compound represented by formula (1-10):

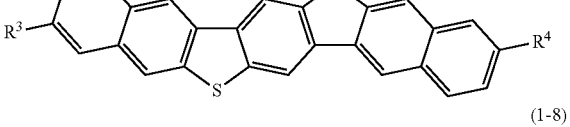

(1-7)

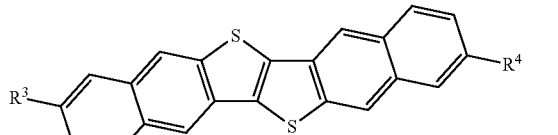

(1-8)

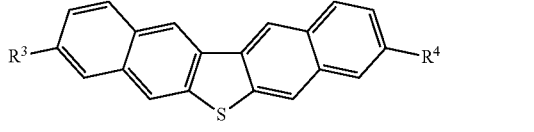

(1-9)

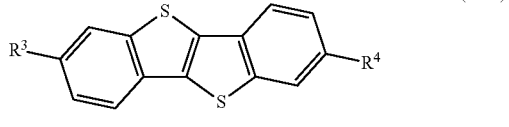

(1-10)

wherein $R^3$ and $R^4$ are the same or different and each represent a $C_{1-20}$ alkyl group, a $C_{6-13}$ aryl group, a pyridyl group, a furyl group, a thienyl group, or a thiazolyl group.

3. The composition for manufacturing an organic semiconductor device according to claim 1 or 2, wherein a content of the solvent in the composition for manufacturing an organic semiconductor device is 99.999 wt % or less.

4. The composition for manufacturing an organic semiconductor device according to claim 1, wherein a content of the organic semiconductor material in the composition for manufacturing an organic semiconductor device is 0.005 parts by weight or more based on 100 parts by weight of the solvent.

5. The composition for manufacturing an organic semiconductor device according to claim 1, wherein a content of 2,3-dihydrobenzofuran in the solvent contained in the composition for manufacturing an organic semiconductor device is 50 wt % or more.

6. The composition for manufacturing an organic semiconductor device according to claim 1, wherein a content of the at least one compound selected from the group consisting of the compound represented by formula (1-1), the compound represented by formula (1-2), the compound represented by formula (1-3), the compound represented by formula (1-4), the compound represented by formula (1-5), and the compound represented by formula (1-6) in the organic semiconductor material contained in the composition for manufacturing an organic semiconductor device is 50 wt % or more.

* * * * *